United States Patent [19]

Krauss

[11] 4,271,517

[45] Jun. 2, 1981

[54] CIRCUIT ARRANGEMENT FOR THE FORMATION OF CHECK BITS FOR BINARY DATA

[75] Inventor: Karl-Heinz Krauss, Planegg, Fed. Rep. of Germany

[73] Assignee: Siemens Aktiengesellschaft, Berlin & Munich, Fed. Rep. of Germany

[21] Appl. No.: 971,029

[22] Filed: Dec. 19, 1978

[30] Foreign Application Priority Data

Dec. 30, 1977 [DE] Fed. Rep. of Germany ....... 2758952

[51] Int. Cl.³ ............................................. G06F 11/10
[52] U.S. Cl. ................................................... 371/37
[58] Field of Search ................. 340/146.1 AL; 371/37

[56] References Cited

U.S. PATENT DOCUMENTS

| | | |
|---|---|---|
| 3,798,597 | 3/1974 | Frumbs et al. ............ 340/146.1 AL |
| 3,825,893 | 7/1974 | Bossen et al. ............. 340/146.1 AL |
| 3,893,070 | 7/1975 | Bossen et al. ............. 340/146.1 AL |
| 4,160,236 | 7/1979 | Oka et al. .................... 340/146.1 AL |

OTHER PUBLICATIONS

Jones, "Redundancy Checking by Table Look-Up", *IBM Technical Disclosure Bulletin*, vol. 13, No. 11, Apr. 1977, pp. 3322-3323.

Siemens, *Datenbuch 1974/75*, vol. 1, pp. 191-193 & 226-229.

Siemens, *Datenbuch 1977/77*, System SAB 8080, pp. 63-64, 219-220 & 256-259.

*Primary Examiner*—David H. Malzahn
*Attorney, Agent, or Firm*—Hill, Van Santen, Steadman, Chiara & Simpson

[57] ABSTRACT

The invention relates to a circuit arrangement for coding or decoding comprising apparatus for forming check bits with the use of a linear code. The coding should be capable of adaptation to a desired coding scheme in the simplest manner. The invention provides a binary memory which stores each digit position of the binary information and has an allocated check digit position word. There is connected to the output side of the memory a modulo-2-adder cricuit for the purpose of adding check digit position words, and depending upon the binary information received, indicates whether or not it is correct. A circuit arrangement in accordance with the invention is particularly suited for utilization in remote control installations.

4 Claims, 3 Drawing Figures

CIRCUIT ARRANGEMENT FOR THE FORMATION OF CHECK BITS FOR BINARY DATA

BACKGROUND OF THE INVENTION

1. Field of the Invention

The invention relates to a circuit arrangement for coding or decoding comprising an installation for the formation of a number of check bits depending upon binary data or information having a plurality of digit positions, arranged according to a linear code.

2. Description of the Prior Art

In the coding and decoding of binary data, it is known to carry out parity checks or odd-even checks or to utilize feedback shift registers for assuring transmission of correct data. With the aid of feedback shift registers, cyclic codes can be transmitted. The cost outlay increases as a function of the number of check digit positions of the check device.

A coding by means of a feedback shift register is described in the Journal "Electronik", 1976, Vol. 8, Pages 55 through 59. The adaptation to a new code or to codes having different lengths in this system is not possible or is possible only with a very complicated circuit.

SUMMARY OF THE INVENTION

It is the object of the invention to provide a circuit arrangement of the type which will allow adaptation to a desired coding-system of the simplest type.

In this invention the check bits are advantageously derived from a generator matrix of the canonical form.

In the case of linear codes, it is possible to differentiate between k binary message [digit] positions $x_1, x_2, \ldots x_k$ and m binary check [digit] positions $x_{k+1}, x_{k+2}, \ldots, x_{k+m}$. Due to the validity of the expressions for the parallel and serial representation of the code words, discussion will be directed to digit positions instead of steps or signal elements.

The check digit positions are determined from the message information digit positions by use of linear equations using mod-2-calculation. The conditions for these equations can be ascertained from a so-called test program. The following example describes the test program of a linear code with k=4 message digit positions and m=3 check digit positions:

| Message digit positions | | | | Check digit positions | | |
|---|---|---|---|---|---|---|
| $x_1$ | $x_2$ | $x_3$ | $x_4$ | $x_5$ | $x_6$ | $x_7$ |
| 1 | 1 | 1 | 0 | 1 | 0 | 0 |
| 1 | 1 | 0 | 1 | 0 | 1 | 0 |
| 1 | 0 | 1 | 1 | 0 | 0 | 1 |

Each test line corresponds to a linear equation; e.g., the second test line of the equation $$1.x_1 + 1.x_2 + 0.x_3 + 1.x_4 + 0.x_5 + 1.x_6 + 0.x_7 = 0 \quad (\text{mod } 2)$$

or converted $$x_6 = x_1 + x_2 + x_4 \quad (\text{mod } 2)$$

with this test line, the check digit location $x_6$ is determined from the message digit positions $x_1, x_2, x_3, x_4$. One can correspondingly derive the conditions for $x_5$ and $x_7$ as:

$$x_5 = x_1 + x_2 + x_3 \quad (\text{mod } 2)$$

$$x_7 = x_1 + x_3 + x_4$$

For given values of the message digit positions of e.g. $(x_1\ x_2\ x_3\ x_4) = (1101)$ and the check locations derived with these equations at $(x_5, x_6, x_7) = 010$.

Thus, the entire code word reads: (1101 010). The check digit positions are formed from the message digit positions by means of parity checks.

In this manner the check digit position $x_6$ supplements and completes the message digit positions $x_1$, $x_2$ and $x_4$, so that an even number results. The formation of this check digit, two operations are necessary. If the same outlay is taken into account also for check digit positions $x_5$ and $x_7$, then, even in the case of this simple example, $3 \cdot 2 = 6$ operations, must be provided for code protection.

The outlay increases considerably with an increasing number of code word digit positions, and becomes very great in the case of longer codes with a high redundancy component.

On the other hand, it is possible to derive from the test scheme of the linear code, a general form with k linear independent equations which are also designated as generator words.

A possible selection for the k equations or generating words are those k code words which contain precisely a "1" in the message digit positions, for the sum modulo 2 of these words cannot be zero. Thus, in the previously discussed example, for the message (0100) the following check digit positions result $$x_5 = 0 + 1 + 0 = 1$$

$$x_6 = 0 + 1 + 0 = 1$$

$$x_7 = 0 + 0 + 0 = 0$$

and hence the code word results is (0100 110). In this manner, the remaining lines can also be calculated to obtain:

$$\begin{bmatrix} 1 & 0 & 0 & 0 & 1 & 1 & 1 \\ 0 & 1 & 0 & 0 & 1 & 1 & 0 \\ 0 & 0 & 1 & 0 & 1 & 0 & 1 \\ 0 & 0 & 0 & 1 & 0 & 1 & 1 \end{bmatrix} = (G)$$

as the so-called generator matrix.

Since a linear code has the property that two code words added together form a new word belonging to the code, it is possible to code for any random message by combining the lines of this generator matrix.

Thus, the code word of the message (1101) results, by adding the first, second and fourth lines of the generator matrix in (1101 010). The description of a code by this arrangement of the generator matrix is also called the "canonical form"

The line vectors of the check or control matrix (H) represent the described test scheme. For this example, the transposed $(H)^T$ of the check or control matrix (H) is:

$$(H) = \begin{bmatrix} 1 1 1 0 1 0 0 \\ 1 1 0 1 0 1 0 \\ 1 0 1 1 0 0 1 \end{bmatrix} ; (H)^T = \begin{bmatrix} 1 1 1 \\ 1 1 0 \\ 1 0 1 \\ 0 1 0 \\ 1 0 0 \\ 0 1 0 \\ 0 0 1 \end{bmatrix}$$

In accordance with the invention, the circuit arrangement is constructed in such a manner that a binary or two-state memory is provided which stores for each digit position of the binary information, an associated check digit position word whose digit position number is equal to the number of check bits, and there is connected to the output side of the memory a modulo-2-adder circuit for the purpose of adding check digit position words, and the check digit position words can be added with one another depending upon the state of the associated bit of the binary information. The check digit position words to be added can be selected from the stored words because only the digit position words pertaining to information digit positions of one state are read out.

All check digit position words can be read out and the modulo-2-adder can be operated or controlled by means of a control signal obtained from the binary information, and can be synchronized with the readout operation, in such a manner that only those check digit position words are added which have an associated information bit with a specified or predetermined state; e.g., the state "1".

A circuit arrangement of this type permits adaptation, in an advantageous manner without costly circuit changes.

In a further embodiment of the invention, the circuit arrangement is designed in such a manner that the check digit positon words for a plurality of binary data or information, having varying numbers of digit positons, can be stored in a read-only memory. In addition, it is possible to store in the memory at least two groups of check digit position words for at least one binary information digit.

In the case of a circuit arrangement of this type, it is possible, to utilize, if needed, codes of different lengths or even varying codes with different safeguard properties.

With the aid of the circuit arrangement, binary information can be coded or decoded with great speed through bit-wise coding because the read-only memory is capable of being read out synchronously with the message bits which are to be read out in serial fashion, and a parellel-series converter is connected to the output side of the adder circuit for this purpose. Subsequent to release or transmission of the last message bit, the check signal is fixed and is added to the binary information.

Also in the case of decoding of a telegram, the check digit positions of the incoming telegram are determined in bit-wise fashion. Subsequent to entry of the last message bit, the check information is then fixed on the receiving side, and can be compared with the subsequently received check bits.

In a further development of the invention, the memory is a component part of an installation for error correction. The memory is simultaneously utilized for the formation of the error check.

BRIEF DESCRIPTION OF THE DRAWINGS

Further objects, advantages and features of the invention will become apparent from the following description when read with the drawings.

DESCRIPTION OF THE PREFERRED EMBODIMENTS

Figure 1:
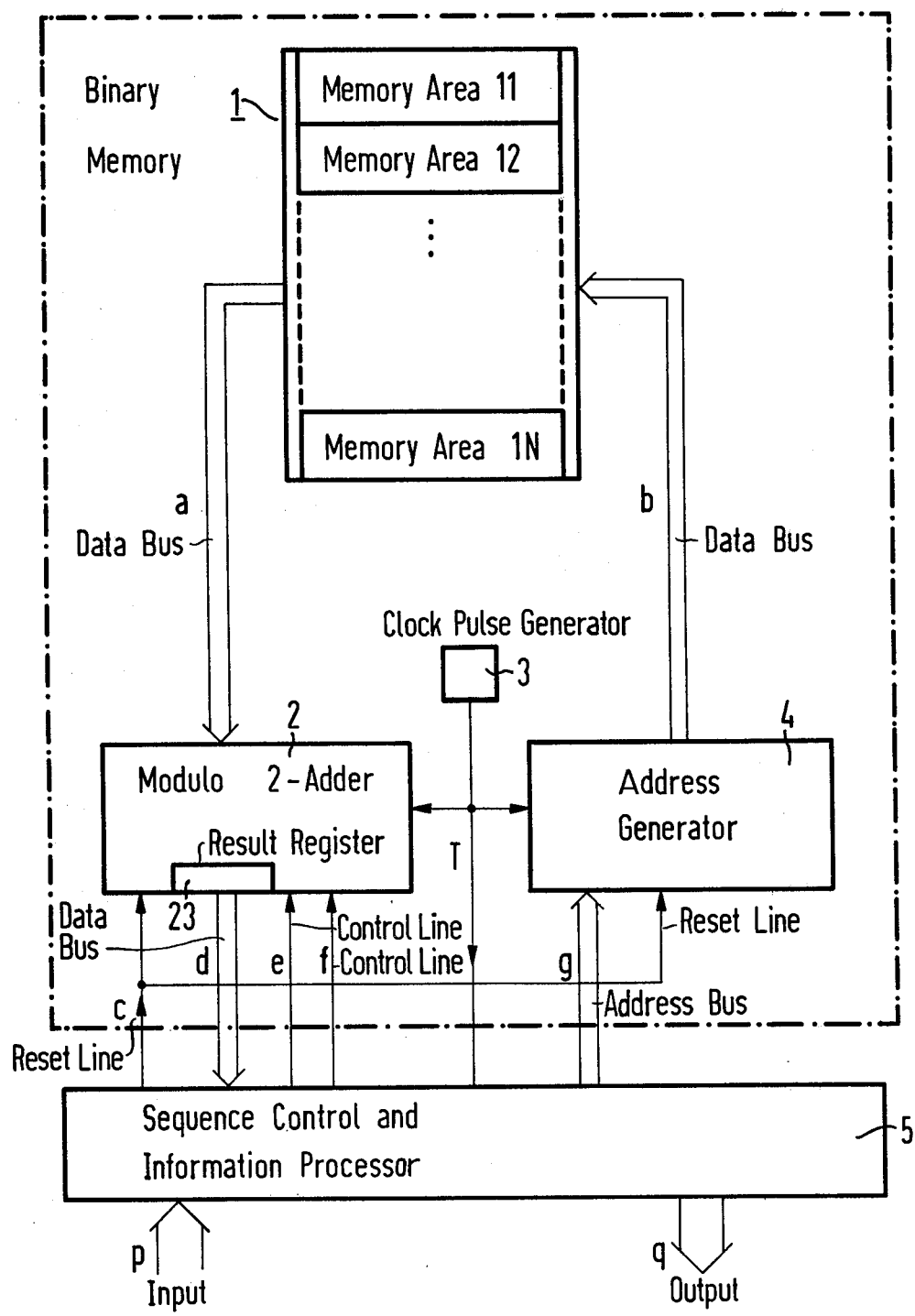
FIG. 1 illustrates a circuit arrangement for the coding of binary information.

The circuit arrangement illustrated in FIG. 1 serves the purpose of providing binary information which can be checked for accuracy. The binary information is supplied in the form of input information at the input p of the sequence control and information processor installation 5, which serves the purpose of operational sequence control and information processing. The output information, which is composed of the input information and the checking appendix, is released at output q.

Installation 5, modulo-2-adder 2, and address generator transmitter 4, are connected to the clock pulse generator 3 as shown.

Memory 1 is a read-only memory which contains the storage areas 11 . . . IN. Associated with each of these memory areas 11 . . . IN is an address, and in each memory area the check matrix of a specified code is stored in the so-called canonical form. If the check words of a plurality of different codes are stored in the memory, then, codes of equal length, but having a different hamming or signal-distance can be utilized. By passing to a new address area, it is very simple to calculate the protection appendix of a new code. The first check digit position word of the matrix of each code is located in the address—serving as the starting address—of the storage area.

The address generator-transmitter 4 is first reset by installation 5 via the reset line c, and subsequently, via address bus g, it receives the address of the desired check matrix, and then it is advanced by the clock pulse T.

In this manner, the data of the check digit positions, or the check digit position words, respectively, are read out in chronological sequence from memory A, and transmitted via the data bus "a" to the modulo-2-adder.

Adder 2 is first reset via the reset line c, and then receives the check digit position words. Adder 2 receives by way of the control line e, simultaneously with each check digit position word, information regarding whether this check digit position word is to be added or not. The memory contains 1 k words with m steps or signal elements. Each word is allocated to a message step and it is recalled when the message step has the characteristic identifying state "1".

The addition-result is stored in the result register 23, and, from there, arrives, via the data bus d, at the installation 5 as soon as installation 5 commands the adder 2 to do this by means of a signal "acceptance" protection appendix" supplied to the control line f.

The coding and decoding proceeds in the following manner:

In order to code the message, the check bits of the generator matrix of the canonical form are defined in the ROM, or read-only memory 1, respectively. The protection appendix is formed adding the check bits in modulo-2 form.

In the stored matrix, the first line is allocated to the first message bit, and the second line is allocated to the second message bit, etc. The last line of the matrix corresponds to the last message bit. For each "1" of a message bit, the corresponding line of the matrix is added up modulo-2. Subsequent to evaluation of the last message bit, the protection appendix is fixed and is definite.

For the initially discussed example, the following coding functional sequence results:

| Memory Address | Memory Contents | | | | | | | | | |
|---|---|---|---|---|---|---|---|---|---|---|
| ADR | 1 1 1 | | | | | | | | | |
| ADR + 1 | 1 1 0 | | $x_1$ | $x_2$ | $x_3$ | $x_4$ | $x_5$ | $x_6$ | $x_7$ |
| ADR + 2 | 1 0 1 | Message | 1 | 1 | 0 | 1 | ? | ? | ? |
| ADR + 3 | 0 1 1 | | | | | | | | | |

Since the digit position x of the message is a "1", the memory contents of the address ADR is read. Since $x_2$ also contains the value "1", the memory contents of ADR and ADR+1 are added modulo-2 in the adder 2. The digit position $x_3$ contains "0", and $x_4$ contains the value "1"; consequently, the adder 2 additionally adds the memory contents of the address ADR+3 to the calculated sum. The end result is 010, and is annexed to the information bits as a protection appendix.

Figure 3:
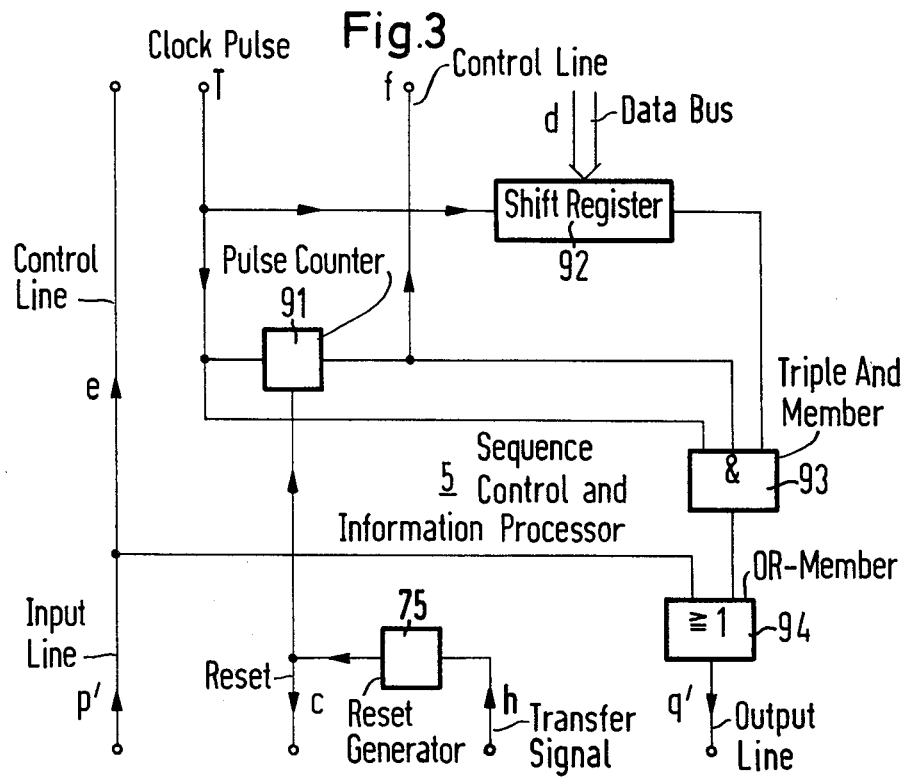
FIG. 3 illustrates a circuit arrangement for adding a protection component to a pulse telegram.

The example makes it clear that, in the case of a telegram to be transmitted in a serial fashion, the check bits can be advantageously determined synchronously with each transmitted message bit. By means of this procedure, a very rapid processing of the message digit positions is possible. A circuit arrangement of this type is shown in FIG. 3.

Figure 2:
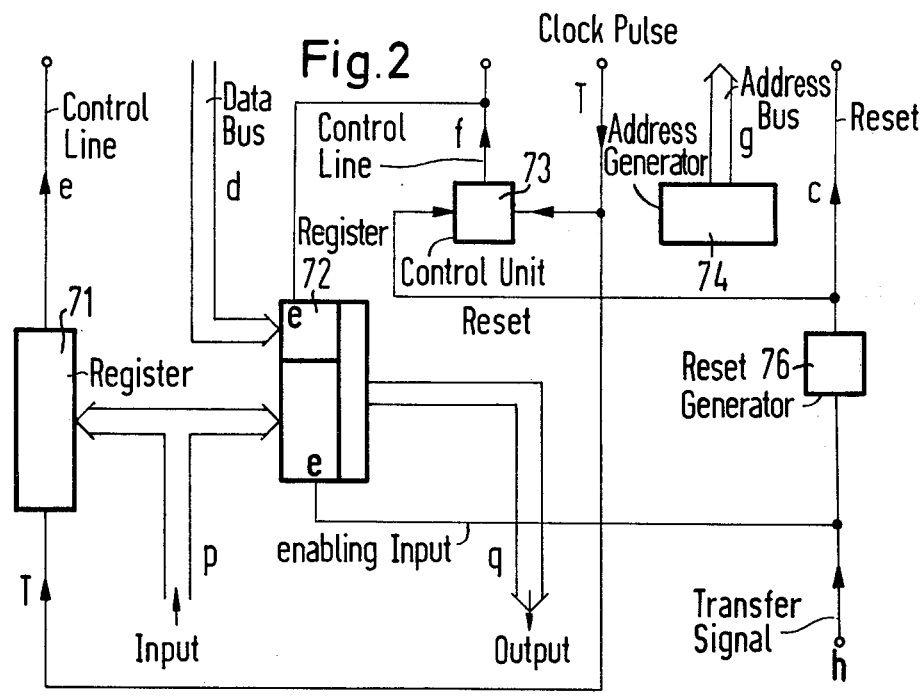
FIG. 2 shows the details of an installation—contained in the circuit arrangement according to FIG. 1—for the purpose of information processing and functional sequence control.

Further details of the installation 5 are apparent from FIG. 2. The input information is supplied to registers 71 and 72, via the input p, in the form of parallel information. Subsequently, the information stored in register 71 is output in a serial fashion to control line e with the aid of the clock pulse T.

Register 72, in addition to the portion connected to the input p, contains additional stages which are connected to the data bus d and which are provided for the purpose of storage of the protection appendix. Input information and protection appendix signals are jointly output via data bus q. The enable-input e of the portion connected to data bus d is connected to the "coding completed" for producing the signal f. The enable-input e of the portion connected to data bus p is connected to the line for generating the transfer signal h. Also, with the aid of the address generator-transmitter 74, the desired memory area-address can be transmitted to the address bus g. Address generator 74 can be a switch arrangement which allows the desired memory area to be set.

The control unit 73 emits the signal "acceptance protection appendix" to the control line f. The control unit 73 is a counter operated and controlled with the clock pulse T, and can be reset by means of the reset signal generator-transmitter 76 which counts up to a number of clock pulses corresponding to the number of information bits. In particular, the number to be counted can be adjusted to the respective number of information bits. The reset signal generator-transmitter 76 can e.g. be a Schmitt-trigger, and is activated by the transfer signal h.

Advantageously, the binary memory can be a component part of an installation, not illustrated in the Figure, for error correction.

The correction of an individual error, or of an individual error-word with the hamming-weight 1 is possible with little cost and equipment outlay. The so-called syndrome, or the corrector s, respectively, is an $(n-k)-$[digit] position vector which results from a received word (w) and is:

$$(s) = (w) \ (H)^T$$

If (w) is a code word without interference or malfunction, (s)=0 must be valid. A correction is thus not required. If (s) 0, then precisely that particular location is corrected at which this line vector is $(H)^T$. $(H)^T$ contains the check digit positions of the generator matrix of the canonical form. In the case of the initially cited example, the code word (u)=(1100 001) is transmitted, and the code word (w)=(1101 001) is received. Thus, the falsification of one single or individual bit digit position is present. The syndrome results (or amounts) to $$(s) = (1101\ 001) \begin{bmatrix} 1 & 1 & 1 \\ 1 & 1 & 0 \\ 1 & 0 & 1 \\ 0 & 1 & 1 \\ 1 & 0 & 0 \\ 0 & 1 & 0 \\ 0 & 0 & 1 \end{bmatrix} = (011)\ 0$$

The syndrome (011) corresponds to the malfunction of the fourth code word digit position.

Expediently, the receiving station receives the check digit positions formed in the transmitter and simultaneously determines, with the aid of the stored check digit position bytes, the check digit positions of the incoming message or information. If the two values do not correspond or agree, they are added modulo 2 in an adder and result in the syndrome (s). In other words:

$$(s) = (k_u) + (k_w)$$

For the example indicated there results $$\begin{aligned}(k_u) &= 0\ 0\ 1 \\ (k_w) &= \underline{0\ 1\ 0} \\ (s) &= 0\ 1\ 1 \quad \text{modulo 2}\end{aligned}$$

FIG. 3 illustrates details of installation 5 for the case where the input information and the output information are serial data.

The input information is received from the input line p', the control line e and is supplied as an input to the OR-circuit 94, whose other input is received from to the triple-AND-member 93.

By way of data bus d, the protection appendix reaches shift register 92. With the aid of clock pulse T, the protection appendix is shifted out of shift register 92 and is conveyed in a serial fashion to one input of the AND-member 93. The two additional inputs of the AND-member 93 are the clock pulse T, and the output signal of the counter 91 controlled by the clock pulse T.

The output of the counter 91 is, in addition, conveyed to the control line f.

By way of line p' and the OR-member 94 connected to the output side, the pulse telegram reaches the output line q'. Simultaneously, the information bits of the pulse telegram are conveyed via the line e to the not-illustrated modulo-2-adder.

Pulse counter 91 is first reset with the aid of the reset signal transmitter generator 75 which is controllable by the transfer signal h. Subsequently, counter 91 counts up to a number of clock pulses T which is equal to the number of information bits of the pulse telegram. Upon reaching this number, the counter releases and delivers a criterion at its output which is supplied by line f, to the modulo-2-adder as the criterion "acceptance protection appendix". Moreover, the output signal of the counter 61 is conveyed to an input of the triple-AND-member 93, and makes it possible for the protection appendix to reach the OR-member 94 via the AND-member 93.

In this manner it is possible for a pulse telegram to be released at the output line q' which pulse telegram consists of the information bits of the input telegram and the following protection appendix.

Expediently, a microprocessor can be utilized, respectively, as the apparatus for the functional sequence control mechanism.

In various known telecontrol or remote control systems, the data are exchanged between the stations by means of telegrams which contain k messages and m check steps. With the aid of the check steps, the receiving station can test or verify whether the message has been transmitted undisturbed. The circuit arrangement can be advantageously utilized for the purpose of protecting or safeguarding remote control telegrams of this type. The outlay for this purpose increases with the demand for the protection of a message to be transmitted.

It is of particular advantage that the code words of a protected code can be established according to a selectable specification. While the remote control apparatus transmits the message steps in sucession, the words called up or re-called from memory 1 are added in the register 23 of adder 2. If the last message step or signal element, has been transmitted, the m check steps pertaining to the telgram in the register 23 are prepared and are ready for transmission.

Examples of available equipment for the invention are:

(a) In the circuit arrangement according to FIG. 1 for the installation 5 for functional sequence control, a microprocessor SAB 8080 can be used.

The memory 1 can be a ROM of type SAB 8708. The microprocessor SAB 8080 and the ROM type SAB 8708 are listed in the data book: "Siemens Mikroprozessor Bausteine, Datenbuch 1976/1977, System SAB 8080".

The adder 2 can be an exclusive -OR-gate of type CD 4070 available from the RCA Company.

The intermediate memory 23 can be a latch of type SAB 8212 available from the Siemens Company.

The address transmitter generator 4 can be a preadjustable 4-bit-binary counter of type SN 74,196.

(b) In circuit arrangement according to FIG. 2 the register 71 can be several shift registers of type SN 7494. The type SN 74,196 and type SN 7494 are available from the Texas Instrument Company.

The register 72 can be several latches of type 8212.

The control member 73 can be two binary counters of type 74,196 with output-connected output gates.

(c) In the circuit arrangement according to FIG. 3 the counter 91 can be two binary counters of type 74,196 and the shift register 92 can be a type 7494.

Although the invention has been described with respect to certain modifications it is not to be so limited as changes and modifications can be made which are within the full intended scope as defined by the appended claims.

I claim as my invention:

1. A circuit arrangement for the formation of check bits for binary data comprising, apparatus for forming a number of check bits as a function of binary data indicating a plurality of digit positions, used in a linear code, comprising a binary memory (1) which receives and stores for each digit position of the binary data, an allocated check digit position word which has a position number equal to the number of check bits, a modulo-2-adder circuit (2) connected to the output of said memory for the purpose of adding check digit position words, the check digit position words are added to each other as a function of the state of the allocated bit of the binary data (k), and a result register (23) in said modulo-2-adder circuit (2) containing the output of said modulo-2-adder circuit (2).

2. A circuit arrangement according to claim 1 wherein said binary memory (1) is a read-only memory, and the check digit position words are stored therein for a plurality of binary information positions (k) for indicating a varying number of digit positions.

3. A circuit arrangement according to claim 1, wherein at least two groups of check digit position words for at least one binary information (k) are stored in said binary memory (1).

4. A circuit arrangement according to claim 1, wherein said binary memory (1) is a read-only memory of an installation for error correction, an address generator (4) supplying an output to said binary memory (1), a sequence control and information processor (5) supplying outputs to said address generator (4) and receiving inputs from said modulo-2-adder (2) and a clock pulse generator (3) supplying outputs to said address generator (4), said modulo-2-adder (2) and said sequence control and information processor (5).

* * * * *